United States Patent [19]
Chaiken

[11] Patent Number: 6,124,712
[45] Date of Patent: Sep. 26, 2000

[54] APPARATUS AND METHOD FOR IMAGING METALLIC OBJECTS USING AN ARRAY OF GIANT MAGNETORESISTIVE SENSORS

[75] Inventor: Alison Chaiken, Fremont, Calif.

[73] Assignee: The Regents of the University of California, Oakland, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/857,319

[22] Filed: May 16, 1997

[51] Int. Cl.[7] ........................................... G01V 3/08
[52] U.S. Cl. ........................................... 324/326
[58] Field of Search .............. 324/207.21, 252, 324/326, 260, 327, 328, 329, 67; 338/32 R

[56] References Cited

U.S. PATENT DOCUMENTS

| | | | |
|---|---|---|---|
| 4,021,725 | 5/1977 | Kirkland | 324/326 |
| 5,093,622 | 3/1992 | Balkman | 324/326 |
| 5,296,807 | 3/1994 | Kousek et al. | 324/326 |
| 5,321,361 | 6/1994 | Goodman | 324/326 |
| 5,557,277 | 9/1996 | Tricoles et al. | 324/326 |
| 5,818,227 | 10/1998 | Payne et al. | 324/260 |

FOREIGN PATENT DOCUMENTS 2273572  6/1994  United Kingdom .................. 324/326

*Primary Examiner*—Jay Patidar
*Attorney, Agent, or Firm*—L. E. Carnahan

[57] ABSTRACT

A portable, low-power, metallic object detector and method for providing an image of a detected metallic object. In one embodiment, the present portable low-power metallic object detector an array of giant magnetoresistive (GMR) sensors. The array of GMR sensors is adapted for detecting the presence of and compiling image data of a metallic object. In the embodiment, the array of GMR sensors is arranged in a checkerboard configuration such that axes of sensitivity of alternate GMR sensors are orthogonally oriented. An electronics portion is coupled to the array of GMR sensors. The electronics portion is adapted to receive and process the image data of the metallic object compiled by the array of GMR sensors. The embodiment also includes a display unit which is coupled to the electronics portion. The display unit is adapted to display a graphical representation of the metallic object detected by the array of GMR sensors. In so doing, a graphical representation of the detected metallic object is provided.

22 Claims, 4 Drawing Sheets

APPARATUS AND METHOD FOR IMAGING METALLIC OBJECTS USING AN ARRAY OF GIANT MAGNETORESISTIVE SENSORS

The United States Government has rights in this invention pursuant to Contract No. W-7405-ENG-48 between the United States Department of Energy and the University of California, for the operation of Lawrence Livermore National Laboratory.

BACKGROUND OF THE INVENTION

1. Field of the Invention

This invention relates to the detection of metallic objects. Specifically, the present invention relates to the detection of metallic objects using an array of imaging giant magnetoresistive sensors.

2. Description of Related Art

Cleanup of unexploded ordnance (UXO) items is a major responsibility for the United States Armed Forces. Such cleanup operations are necessitated as part of the restoration of formerly used defense sites (FUDS) back to civilian use. Given that millions of acres of government property, e.g. FUDS, are contaminated by UXO items, cleanup of FUDS is an expensive undertaking which requires an efficient and accurate solution. As yet another consideration, UXO emplacement is a major problem worldwide. That is, UXO items are responsible for the worldwide death of numerous unsuspecting civilians each year. Thus, UXO detection has substantial utility throughout the United States and the rest of the world.

Many techniques are in use, or have been proposed for use, in UXO detectors. Two of the most commonly employed technologies are electromagnetic induction detection, and fluxgate magnetometry. Time-domain analysis of inductive signals produced by such detection technologies has been suggested as one way to differentiate between hazardous and benign types of buried material. However, neither an induction detector nor a fluxgate magnetometer can be engineered to produce an image of potential UXO objects.

Generating an image of a buried object would tremendously aid in the elimination of false positive UXO detections. False positive UXO detections account for a great part of the expense associated with UXO remediation. That is, prior art detection systems such as pulsed electromagnetic induction systems and cesium-vapor magnetometers are unable to distinguish between UXO and other metallic ground clutter. The inspection of false positives during cleanup of contaminated areas adds greatly to the cost and duration of site remediation. Typically, 50 to 60 pounds of scrap metal are recovered for each ordnance item found using conventional UXO detection technology. An easy-to-use "imaging" UXO detection system would allow a relatively inexperienced user to rapidly distinguish between buried ordnance and other ferrous objects. Hence, an inexperienced user could easily distinguish between, for example, shrapnel or soda cans, or truly dangerous UXO. Thus, the time and expense associated with FUDS remediation could be dramatically reduced by an accurate imaging UXO detection system.

As yet another drawback, prior art UXO detection technologies such as electromagnetic induction and fluxgate magnetometry are not well suited for use in array form as portable UXO detectors. That is, both electromagnetic induction and fluxgate magnetometry sensors are bulky in size and are, therefore, impractical for multi-element portable detector applications.

Furthermore, conventional UXO detection technologies such as the above-mentioned electromagnetic induction and fluxgate magnetometry technologies are ineffective in the presence of a uniform background magnetic field. Hence, such prior art UXO technologies are almost useless for remediation of FUDS situated in strongly magnetic environments. As an example, the Kahoolawe bombing range in Hawaii is located on magnetic volcanic soil. Therefore, prior art UXO detection technologies simply will not work at the Kahoolawe bombing range, or any other strongly magnetic environment.

Although a need exists for an detection system which generates an image of a buried UXO object, a need also exists for a detection system which is well suited to detecting and generating an image of various other metallic objects.

Thus, a need exists for an efficient and accurate unexploded ordnance (UXO) detection system. A further need exists for a UXO detection system which can produce an image of potential UXO objects and eliminate the occurrence of false positive detections. Yet another need exists for a UXO detection technology which can be readily employed in a portable detector. Still another need exists for a UXO detection technology which can function in the presence of magnetic environments such as magnetic soils. A need also exists for an imaging metallic object detector for locating and displaying buried objects other than UXO.

DISCLOSURE OF THE INVENTION

The present invention provides an efficient and accurate unexploded ordnance (UXO) detection system. The present invention further provides a UXO detection system which can produce an image of potential UXO objects and eliminate the occurrence of false positive detections; a UXO detection technology which can be readily employed in a portable detector; and a UXO detection technology which can function in the presence of magnetic environments such as magnetic soils. The present invention also provides an imaging metallic object detector for locating and displaying buried objects other than UXO.

Specifically, in one embodiment, the present invention provides a portable imaging metallic object detector employing giant magnetoresistive (GMR) sensors arranged in a two-dimensional array. In one embodiment, the present portable low-power metallic object detector is comprised of an array of giant magnetoresistive (GMR) sensors. The array of GMR sensors is adapted for detecting the presence of and compiling image data of a metallic object. In the present embodiment, the array of GMR sensors is arranged in a checkerboard configuration such that axes of sensitivity of alternate GMR sensors are orthogonally oriented. An electronics portion is coupled to the array of GMR sensors. The electronics portion is adapted to receive and process the image data of the metallic object compiled by the array of GMR sensors. The present embodiment also includes a display unit which is coupled to the electronics portion. The display unit is adapted to display a graphical representation of the metallic object detected by the array of GMR sensors. In so doing, a graphical representation of the detected metallic object is provided.

In another embodiment, the present invention includes a second array of GMR sensors in addition to the features of the above described embodiment. The second array of GMR sensors is disposed orthogonal to the first array of GMR sensors. By employing three orthogonally disposed arrays of GMR sensors, the present embodiment is able to provide a three-dimensional image of the metallic object detected by the first, second, and third arrays of GMR sensors.

These and other objects and advantages of the present invention will no doubt become obvious to those of ordinary skill in the art after having read the following detailed description of the preferred embodiments which are illustrated in the various drawing figures.

BRIEF DESCRIPTION OF THE DRAWINGS

The accompanying drawings, which are incorporated in and form a part of this specification, illustrate embodiments of the invention and, together with the description, serve to explain the principles of the invention.

BEST MODE FOR CARRYING OUT THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

The giant magnetoresistance (GMR) effect is a very large change in electrical resistance that is observed in a ferromagnet/paramagnet multilayer structure when the relative orientations of the magnetic moments in alternate ferromagnetic layers change as a function of an applied field. The basis of the GMR is the dependence of the electrical resistivity of electrons in a magnetic metal on the direction of the electron spin, either parallel or antiparallel to the magnetic moment of the films. Electrons which have a parallel spin undergo less scattering and therefore have a lower resistance. When the moments of the magnetic layers (NiFe below) are antiparallel at low field, there are no electrons which have a low scattering rate in both magnetic layers, causing an increased resistance. At applied magnetic fields where the moments of the magnetic layers are aligned, electrons with their spins parallel to these moments pass freely through the solid, lowering the electrical resistance. The resistance of the structure is therefore proportional to the cosine of the angle between the magnetic moments in adjacent magnetic layers.

Figure 1A:
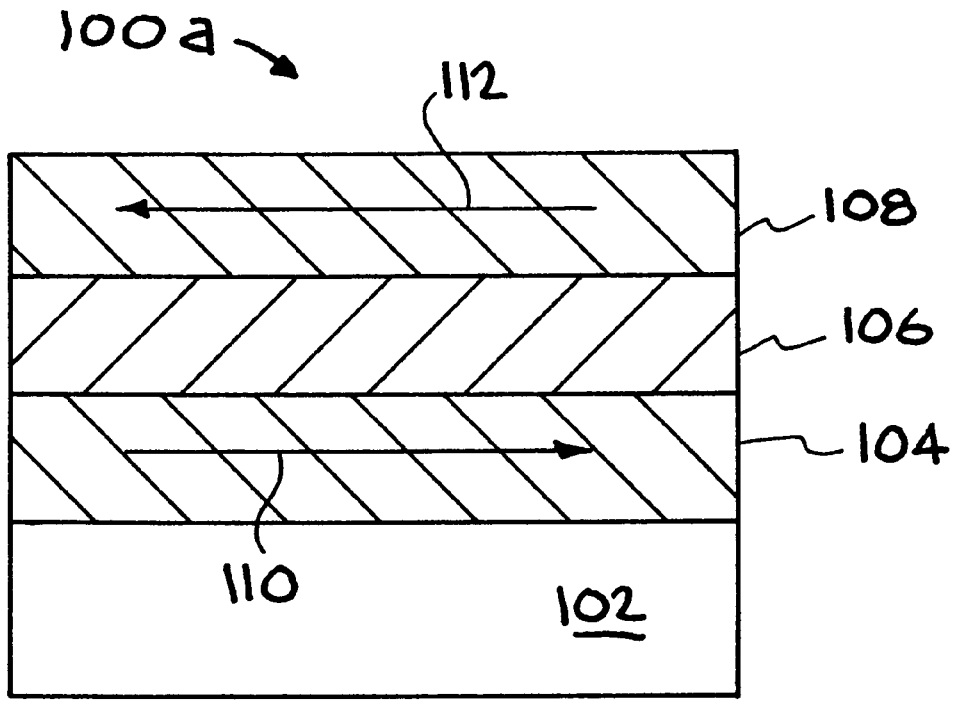
FIG. 1A is a representation of a Zero-Field High Resistance State occurring in a ferromagnet/paramagnet multilayer structure.
Figure 1B:
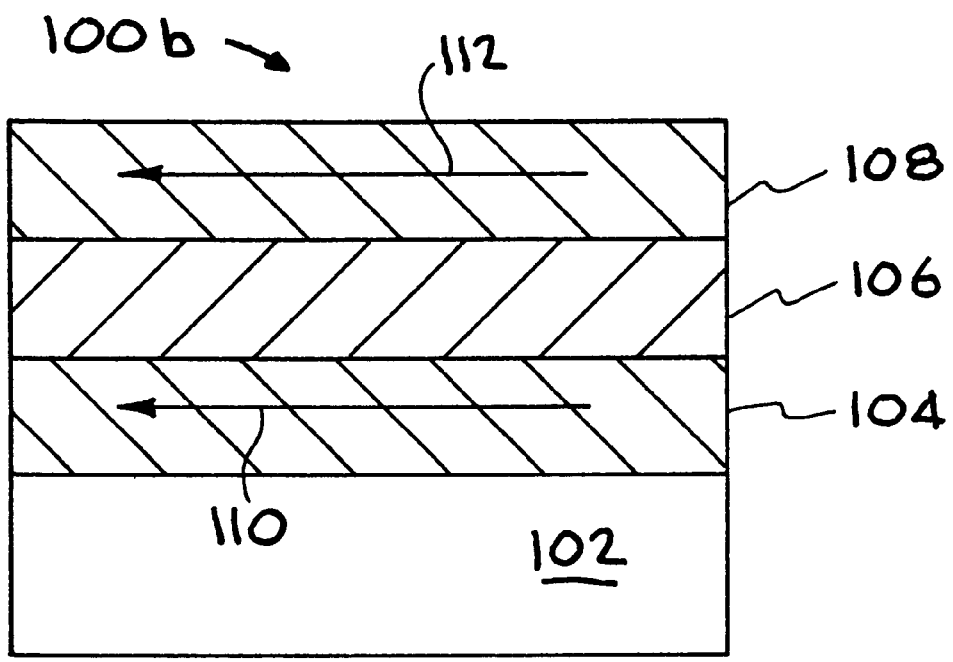
FIG. 1B is a representation of a High-Field Low Resistance State occurring in a ferromagnet/paramagnet multilayer structure.

With reference now to FIGS. 1A and 1B, ferromagnet/paramagnet multi-layer structures 100a and 100b are shown. Each of structures 100a and 100b include a substrate 102, a first nickel/iron (NiFe) layer 104, a copper (Cu) layer 106, and a second nickel/iron (NiFe) layer 108. As shown in FIGS. 1A and 1B, Cu layer 106 is sandwiched between NiFe layers 104 and 108. Arrows 110 and 112 indicate the direction of the moment of magnetic NiFe layers 104 and 108. In FIG. 1A, structure 100a is subjected to a relatively low magnetic field. Under such conditions, the direction of the moment of magnetic NiFe layers 104 and 108 are antiparallel as indicated by arrows 110 and 112. Hence, structure 100a is in a "high resistance" state. On the other hand, in FIG. 1B, structure 100b is subjected to a relatively high magnetic field. Under such conditions, the direction of the moment of magnetic NiFe layers 104 and 108 are parallel as indicated by arrows 110 and 112. Hence, structure 100b is in a "low resistance" state.

Although an NiFe/Cu/NiFe sandwich is shown in FIGS. 1A and 1B, the present invention is also well suited to the use of various other types of materials. That is, the occurrence of the GMR effect depends on the ability of the applied magnetic to switch the relative orientation of the magnetic moments back and forth between the parallel and antiparallel states. In some multilayers a quantum-mechanical interlayer exchange coupling across Cu or another paramagnetic metal causes a zero-field antiparallel alignment which can be overcome by a high applied field. Other multilayers are designed to have an antiparallel state in a limited applied field range by alternating ferromagnetic layers (e.g. cobalt (Co) and Fe layers instead of two NiFe layers) with different intrinsic switching fields.

The magnitude of the GMR effect can be very large, up to 80% at room temperature in Co/Cu multilayers. In the present invention, for maximum output at low magnetic fields, multilayers with 2–3 bilayers and CoFe or NiFe alloy magnetic layers are typically used. Outputs are as large as 12% at 20 Oersted (Oe) in film form, with slightly lower sensitivity found in microfabricated devices. As yet another advantage, GMR sensors require relatively low power during operation.

Figure 2:
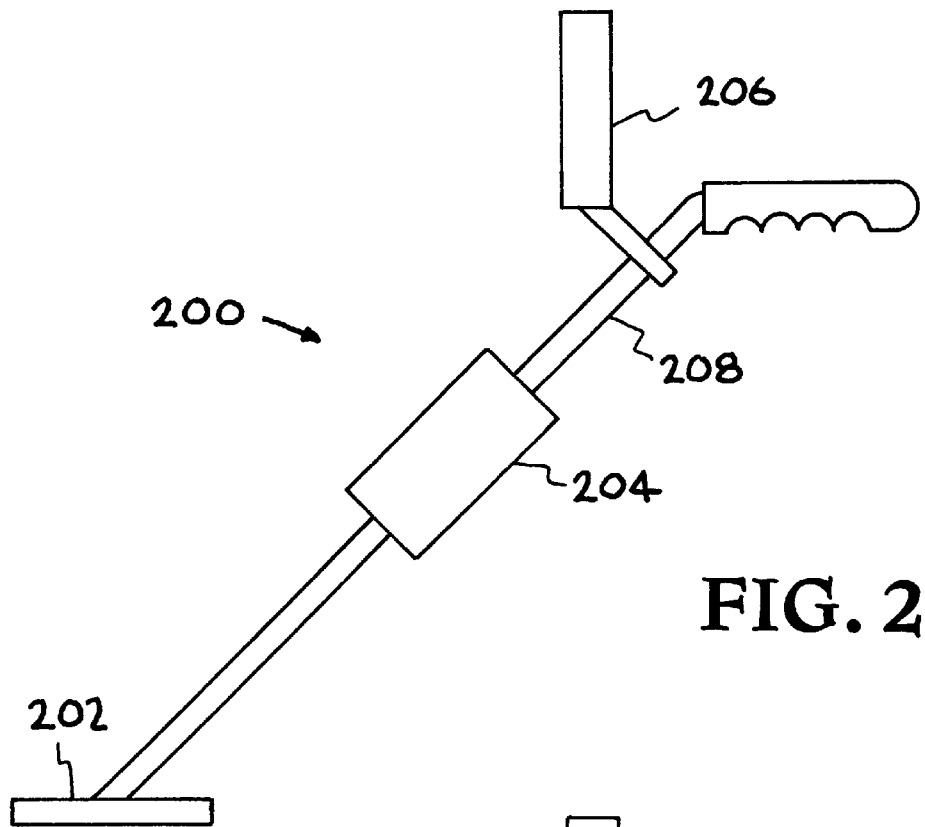
FIG. 2 is a simplified schematic diagram of a portable imaging metallic object detector in accordance with the present invention.

With reference next to FIG. 2, a simplified schematic diagram of one embodiment of the present invention is shown. As mentioned above, in one embodiment, the present invention provides a portable imaging metallic object detector utilizing numerous GMR sensors disposed in a two-dimensional array. In the embodiment of FIG. 2, the present invention is comprised of a sensor assembly 202, an electronics portion 204, and a display unit 206. Each of components 202, 204, and 206, are coupled to a supporting unit 208. Although such an embodiment of the present invention is depicted in FIG. 2, it will be understood that the present invention is well suited to numerous other physical configurations and/or designs. Such various other configurations include, but are not limited to, having the electronics portion located in a back pack, having a hand-held display unit, having the detector system mounted on rollers, and the like. Thus, the present invention is well suited to various physical manifestations which are not explicitly shown for purposes of clarity. Additionally, although much of the following discussion pertains to the detection of unexploded ordnance using the present invention, it will be understood that the present claimed invention is also well suited to locating numerous buried or obscured metallic objects other than unexploded ordnance. Also, the present invention is readily portable due to the compact nature of the present embodiment, and due to the low power requirements of the GMR sensor assembly.

With reference still to FIG. 2, in one embodiment sensor assembly 202 includes GMR sensors such as, for example, NVS5B15 GMR sensors available from Nonvolatile Electronics, Inc., of Eden Prairie, Minn. See "Engineering and Application Notes—Giant Magnetoresistive (GMR) Sensors, Revised Sep. 10, 1998, published by Nonvolatile Electronics, Inc. Although such sensors are employed in the present embodiment, the present invention is also well suited to the use of various other types of GMR sensors.

In the embodiment of FIG. 2, electronics portion 204 of the present invention is comprised of a 15V and 5V power supply. The output from sensor assembly 202 was connected to a National Instruments 64-channel data acquisition card which was installed in a Pentium PC. In the present embodiment, National Instruments' LabView software was used analyze the image data of the magnetic object detected by sensor assembly 202. It will be understood, however, that the present invention is also well suited to using various other electronic assemblies to analyze the image data of the metallic object generated by sensor assembly 202.

With reference yet again to FIG. 2, in the present embodiment, display 206 is comprised of a durable liquid crystal display (LCD) device. The present invention is also well suited to using various other types of displays such as, for example, a cathode ray tube (CRT) display, an active matrix LCD, a flat panel display, and the like.

Figure 3:
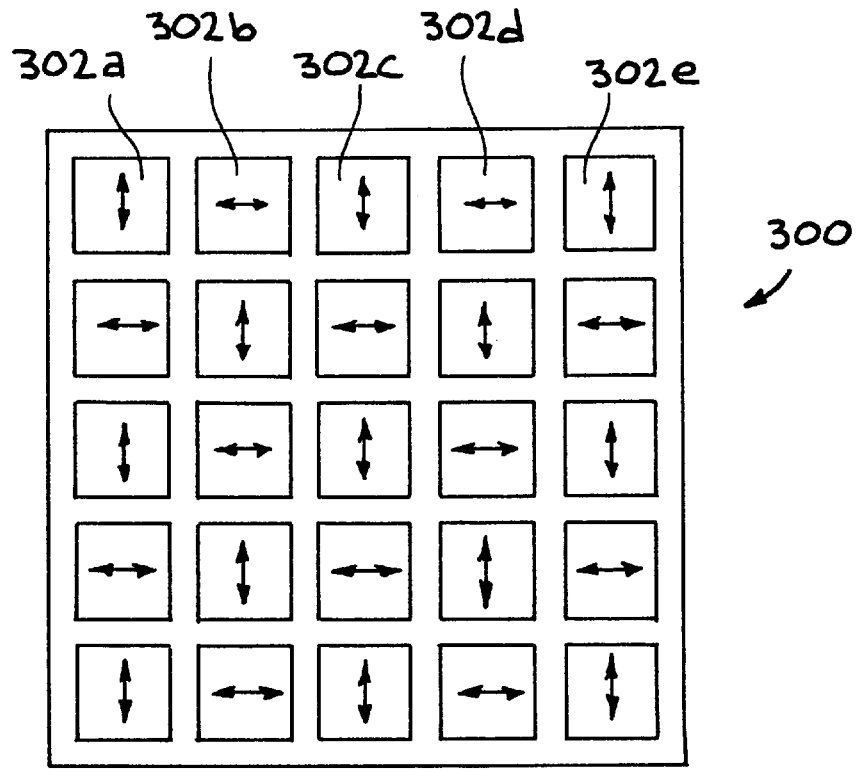
FIG. 3 is a schematic view of one arrangement of GMR sensors disposed within the portable imaging metallic object detector of FIG. 2 in accordance with the present invention.

With reference next to FIG. 3, a schematic view 300 of one arrangement of GMR sensors disposed within sensor assembly 202 of FIG. 2 is shown. In the present embodiment, 25 GMR sensors, typically shown as 302a–302e, are arranged in a 5×5 array, although the present invention is well suited to having a substantially larger array. As shown in FIG. 3, in the present embodiment, GMR sensors 302a–302e are arranged in a "checkerboard" configuration such that axes of sensitivity of alternate sensors are orthogonally oriented. That is, in the embodiment of FIG. 3, the axis of sensitivity of GMR sensor 302a is oriented horizontally, while the axis of sensitivity of GMR sensor 302b is oriented vertically. In so doing, edge affects of buried objects are easily detected and imaged. That is, by determining which of the GMR sensors detects the magnetic flux emanating from the buried object, and by knowing the relative direction of such detecting GMR sensors, the size, shape, and orientation of the buried object is determined by the present invention.

Figure 4:
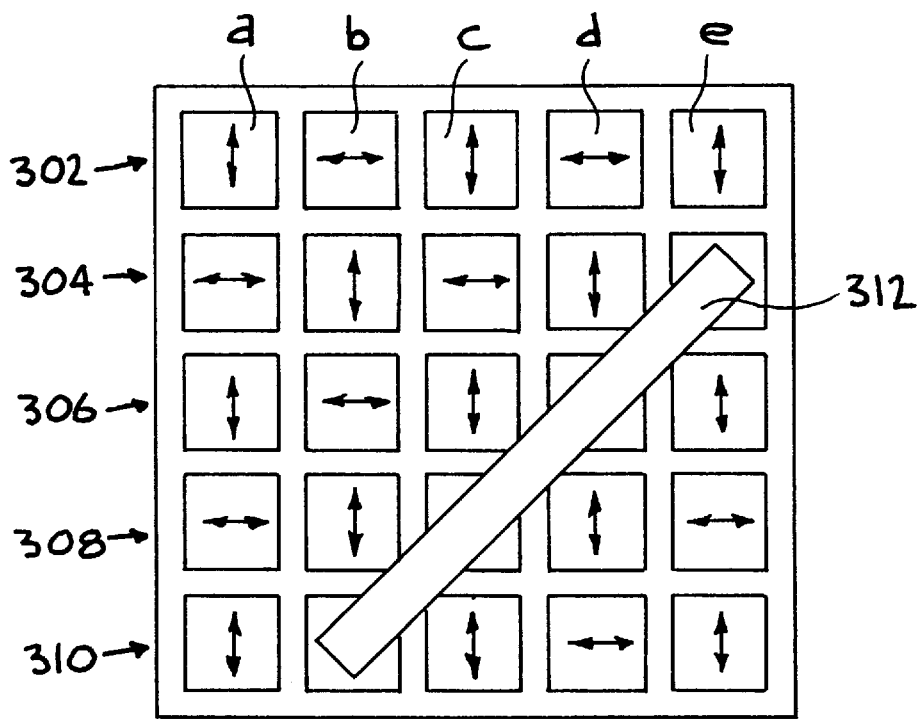
FIG. 4 is a schematic view of one arrangement of GMR sensors disposed within the portable imaging metallic object detector of FIG. 2 having a metallic rod disposed proximate thereto in accordance with the present invention.

Referring now to FIG. 4, a schematic diagram of a metallic rod detected by the present invention is shown. For purposes of clarity metallic rod 312 is shown disposed above the arrangement of GMR sensors in FIG. 4. It will be understood, however, that during use, metallic rod 312 would be buried or otherwise obscured when detected by the present invention. In the embodiment of FIG. 4, each of the GMR sensors can be identified as residing in one of rows 302 through 310, and in one of columns a through e. In the example of FIG. 4, rod 312 is subjected to a magnetic field. The magnetic field emanating from rod 312 is then detected by proximately located GMR sensors having an axis of sensitivity substantially aligned in the same direction as the direction in which the magnetic field emanating from rod 312 is oriented. Thus, in the present example, GMR sensors 302e, 304b, 304c, 304e, 306d, 306e, 308a, 308c, 310a, 310b, and 310c will detect the presence of rod 312. Furthermore, the intensity of the magnetic field detected by each of the above-listed GMR sensors will also vary.

Figure 5:
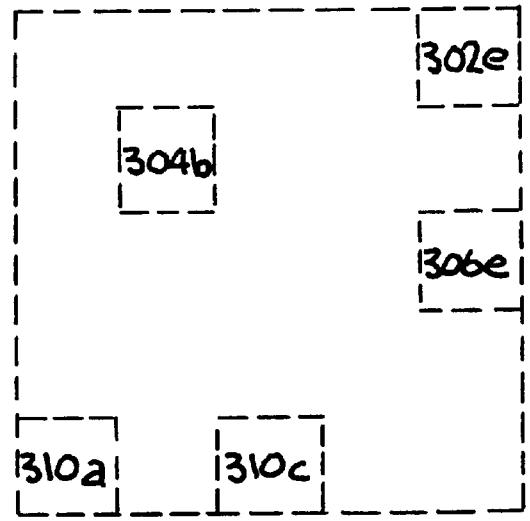
FIG. 5 is a schematic view of the GMR sensors of the arrangement of FIG. 3 which have vertically oriented axes of sensitivity and which detect the presence of the rod of FIG. 4 in accordance with the present invention.

Referring next to FIG. 5, a schematic view of the GMR sensors (having vertically oriented axes of sensitivity) which detect the presence of rod 312 of FIG. 4 is shown. As shown in FIG. 5, GMR sensors 302e, 304b, 306e, 310a, and 310c detect the presence of rod 312. Additionally, in the present example, the magnitude of the magnetic field is greatest at GMR sensor 302e located near the end of rod 312.

Figure 6:
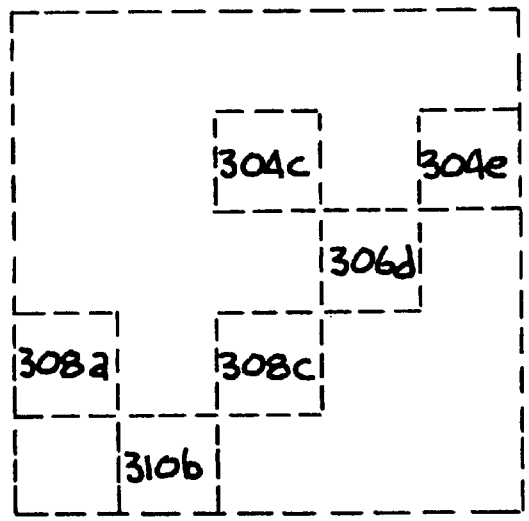
FIG. 6 is a schematic view of the GMR sensors of the arrangement of FIG. 3 which have horizontally oriented axes of sensitivity and which detect the presence of the rod of FIG. 4 in accordance with the present invention.

Referring now to FIG. 6, a schematic view of the GMR sensors (having horizontally oriented axes of sensitivity) which detect the presence of rod 312 of FIG. 4 is shown. As shown in FIG. 6, GMR sensors 304c, 304e, 306d, 308a, 308c, and 310b detect the presence of rod 312. Additionally, in the present example, the magnitude of the magnetic field is greatest at GMR sensors 304e and 306d.

Figure 7:
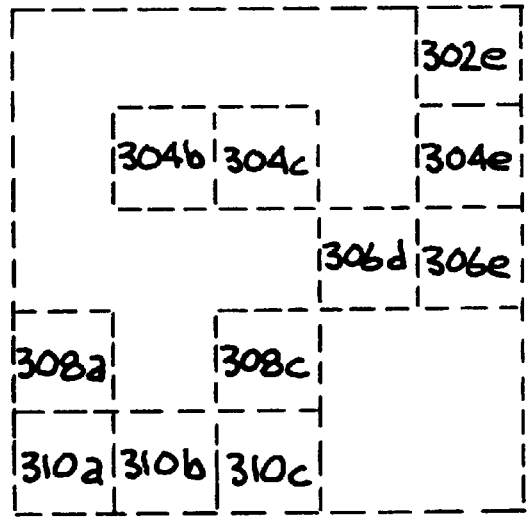
FIG. 7 is a schematic view of the GMR sensors of the arrangement of FIG. 3 which have either vertically or horizontally oriented axes of sensitivity and which detect the presence of the rod of FIG. 4 in accordance with the present invention.

With reference next to FIG. 7, a schematic view of the GMR sensors (having either vertically or horizontally oriented axes of sensitivity) which detect the presence of rod 312 of FIG. 4 is shown. Hence, as stated above, GMR sensors 302e, 304b, 304c, 304e, 306d, 306e, 308a, 308c, 310a, 310b, and 310c will detect the presence of rod 312. By determining which detectors detect the presence of the magnetic field emanating from the object, and by determining the magnitude of the field detected by the GMR sensors, the present invention is able to produce an image of the detected object. That is, as shown in FIG. 5, the magnetic poles on the ends of rod 312 are being detected by vertically oriented GMR sensors located at the upper right and lower left corners of the array. In FIG. 6, however, the horizontally oriented sensors detect the magnetic flux leaking from the sides of rod 312. As a result, the general shape and size of rod 312 is readily determined by the present invention. Thus, the present imaging metallic object detector provides a graphical representation of the buried or obscured metallic object being detected. As a result, a user of the present imaging metallic object detector is able to readily distinguish between metallic items of interest (e.g. UXO) and metallic items which are not of interest (e.g. metallic debris). Therefore, the present invention prevents a user from wasting his or her time uncovering or digging up items which are not of interest. That is, the present invention helps to eliminate the occurrence of false positive detections.

In the present embodiment, each of the GMR sensors generates 16 bits of information. Because there are 25 sensors per image, the data files are 50 bytes (25 sensors×16 bits per sensor). In this embodiment, each image of a detected metallic object is comprised of an average of 1000 readouts of the full array of GMR sensors during a 10-second period (i.e. an acquisition rate of 100 Hz). Although such an acquisition rate is used in the present embodiment, the present invention is also well suited to the use of various faster or slower acquisition rates such as, for example, 10 kHz. The acquired data files are then processed by electronics portion 204 of FIG. 2, and the image of the detected metallic object is displayed by display unit 206 also of FIG. 2. In another embodiment of the present invention, the GMR sensors subject the buried metallic object to a rotating alternating-current magnetic field created by two orthogonal sets of coils. In such an embodiment, the pulsed magnetic field eliminates possible confusion created by different remnant states of buried or otherwise obscured metallic objects. Also, the rotating applied magnetic field permits detection of non-magnetic metallic objects.

Additionally, in the present invention, a background signal can be measured before attempting to locate a particular metallic object. The background signal is stored and then subtracted from subsequent measurements. In so doing, an image of a buried or obscured metallic object can be obtained even in strongly magnetic environments (e.g. a magnetic environment having a magnetic field of about fifteen times the earth's magnetic field). Hence, the array-based detector of the present invention is usable with magnetic soils such as those found on the former naval bombing range on the Hawaiian island of Kahoolawe. Additionally, known structures such as, for example, re-bar in a concrete floor, can essentially be subtracted from an image using the present invention. Thus, a specific buried or obscured metallic object can be located and distinguished from other buried or obscured metallic objects using the present invention.

Figure 8:
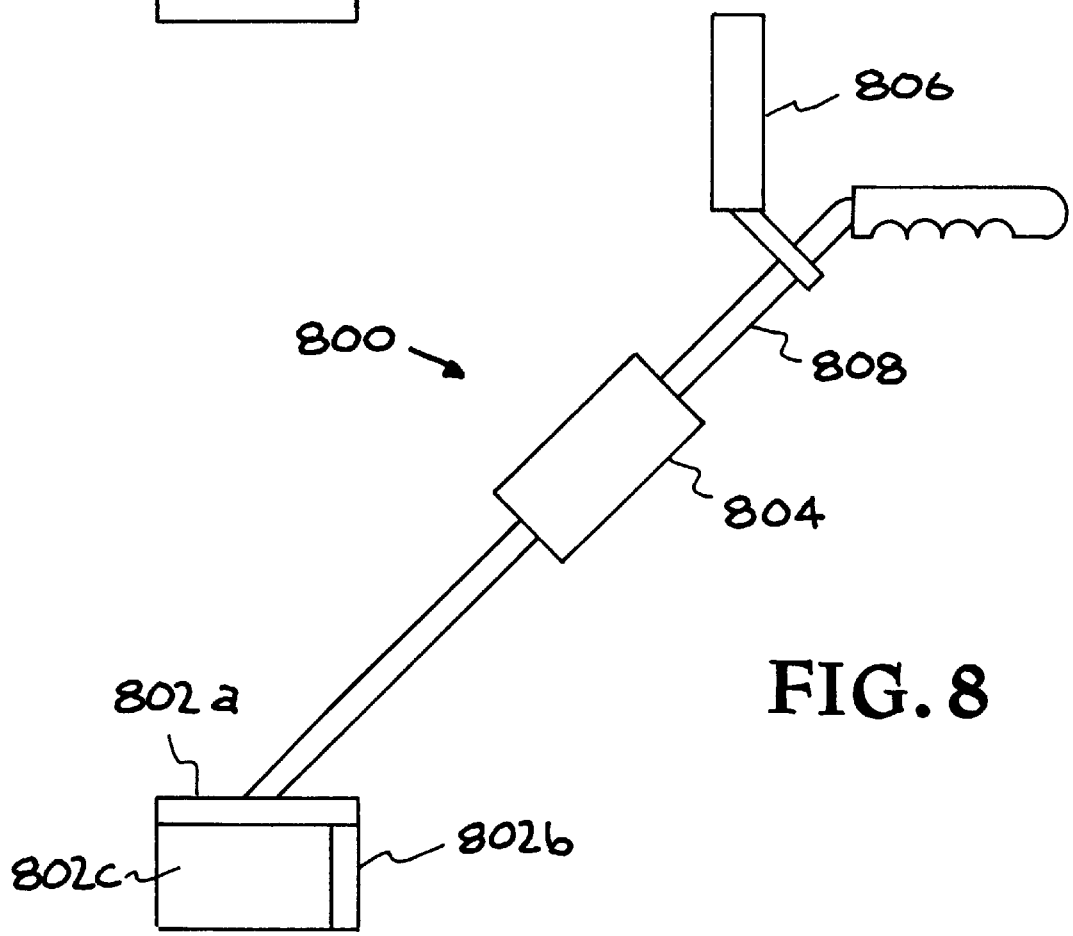
FIG. 8 is a simplified schematic diagram of a portable three-dimensional imaging metallic object detector in accordance with the present invention.

With reference next to FIG. 8, another embodiment of the present invention is shown. In the present embodiment, the present invention provides a portable three-dimensional imaging metallic object detector utilizing three orthogonally disposed arrays 802a, 802b, 802c of GMR sensors. By arranging the three arrays 802a, 802b, and 802c in an orthogonal manner as shown, the present embodiment is able to generate a three-dimensional image of a buried or otherwise obscured object. The embodiment shown in FIG. 8 is comprised of a three-part orthogonally arranged sensor assembly 802a, 802b, and 802c an electronics portion 804, and a display unit 806. Each of components 802, 804, and 806, are coupled to a supporting unit 808. Although such an embodiment of the present invention is depicted in FIG. 2, it will be understood that the present invention is well suited to numerous other physical configurations and/or designs. Such various other configurations include, but are not limited to, having the electronics portion located in a back pack, having a hand-held display unit, having the detector system mounted on rollers, and the like. Thus, the present invention is well suited to various physical manifestations which are not explicitly shown for purposes of clarity.

Thus, the present invention provides an efficient and accurate unexploded ordnance (UXO) detection system. The present invention further provides a UXO detection system which can produce an image of potential UXO objects and eliminate the occurrence of false positive detections; a UXO detection technology which can be readily employed in a portable detector; and a UXO detection technology which can function in the presence of magnetic environments such as magnetic soils. The present invention also provides an imaging metallic object detector for locating and displaying buried objects other than UXO.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

I claim:

1. An imaging metallic object detector comprising: a giant Magnetoresistive (GMR) sensor assembly, said GMR sensor assembly for detecting the presence of and compiling image data of a metallic object;

said GMR sensor assembly being comprised of at least one array of GMR sensors;

said array of GMR sensors being arranged in a checkerboard configuration such that axes of sensitivity of alternate GMR sensors are orthogonally oriented;

an electronics portion electrically coupled to said GMR sensor assembly, said electronics portion adapted to receive and process said image data of said metallic object compiled by said GMR sensor assembly; and a display unit electrically coupled to said electronics portion, said display unit adapted to display a graphical representation of said metallic object detected by said GMR sensor assembly.

2. The imaging metallic object detector of claim 1 wherein said imaging metallic object detector is portable.

3. The imaging metallic object detector of claim 1 wherein said GMR sensor assembly is further comprised of:

a 5×5 array of giant magnetoresistive (GMR) sensors.

4. The imaging metallic object detector of claim 1 wherein said display u nit displays a two-dimensional image of said metallic object detected by said GMR sensor assembly.

5. The imaging metallic object detector of claim 1 wherein said GMR sensor assembly is further comprised of:

said first mentioned array of giant magnetoresistive (GMR) sensors;

a second array of GMR sensors, said second array of GMR sensors disposed orthogonal to said first mentioned array of said GMR sensors; and a third array of GMR sensors, said third array of GMR sensors disposed orthogonal to said first mentioned array and said second array of said GMR sensors.

6. The imaging metallic object detector of claim 5 wherein said first mentioned array of GMR sensors is arranged in a checkerboard configuration such that axes of sensitivity of alternate GMR sensors of said first array are orthogonally oriented.

7. The imaging metallic object detector of claim 5 wherein said second array of GMR sensors is arranged in a checkerboard configuration such th at axes of sensitivity of alternate GMR sensors of said second array are orthogonally oriented.

8. The imaging metallic object detector of claim 5 wherein said third array of GMR sensors is arranged in a checkerboard configuration such that axes of sensitivity of alternate GMR sensors of said third array are orthogonally oriented.

9. The imaging metallic object detector of claim 5 wherein said display unit displays a three-dimensional image of said metallic object detected by said GMR sensor assembly.

10. A method for detecting and providing an image of a metallic object comprising the steps of:

(a) detecting a metallic object and collecting image data of said metallic object using a giant Magnetoresistive (GMR) sensor assembly having at least one array of GMR sensors;

said array of GMR sensors being arranged in a checkerboard configuration such that axes of sensitivity of alternate GMR sensors are orthogonally oriented;

(b) processing said image data collected by said GMR sensor assembly using an electronics portion electrically coupled to said GMR sensor assembly; and (c) displaying said processed image data received from said electronics portion such that a graphical representation of said metallic object detected by said GMR sensor assembly is produced.

11. The method for detecting and providing an image of a metallic object as recited in claim 10 wherein step a) further comprises the step of:

detecting said metallic object and collecting said image data of said metallic object using a 5×5 array of said giant magnetoresistive (GMR) sensors.

12. The method for detecting and providing an image of a metallic object as recited in claim 10 wherein step a) further comprises the step of:

detecting said metallic object and collecting said image data of said metallic object using the first mentioned array of giant magnetoresistive (GMR) sensors and a second array of GMR sensors, said second array of GMR sensors disposed orthogonal to said first mentioned array of said GMR sensors.

13. The method for detecting and providing an image of a metallic object as recited in claim 12 wherein step a) further comprises the step of:

detecting said metallic object and collecting said image data of said metallic object using said first mentioned array of giant magnetoresistive (GMR) sensors and said second array of GMR sensors wherein said second array of GMR sensors is arranged in a checkerboard configuration such that axes of sensitivity of alternate GMR sensors of said second array are orthogonally oriented.

14. The method for detecting and providing an image of a metallic object as recited in claim 12 wherein step c) further comprises the step of:

displaying a three-dimensional image of said metallic object detected by said GMR sensor assembly.

15. The method for detecting and providing an image of a metallic object as recited in claim 10 wherein step a) further comprises the step of:

detecting said metallic object and collecting said image data of said metallic object using said giant magnetoresistive (GMR) sensor assembly and by subjecting said metallic object to a rotating alternating-current magnetic field created by two orthogonal sets of coils.

16. The method for detecting and providing an image of a metallic object as recited in claim 10 wherein step a) further comprises the steps of:

a1) collecting and storing background image data using a giant magnetoresistive (GMR) sensor assembly;

a2) detecting a metallic object and collecting image data of said metallic object using said giant magnetoresistive (GMR) sensor assembly; and a3) subtracting said background image data collected and stored in step a1) from said image data collected in step a2).

17. The method for detecting and providing an image of a metallic object as recited in claim 10 wherein step c) further comprises the step of:

displaying a two-dimensional image of said metallic object detected by said GMR sensor assembly.

18. A portable low-power metallic object detector for providing an image of a detected metallic object, said portable low-power metallic object detector comprising:

an array of giant magnetoresistive (GMR) sensors, said array of GMR sensors for detecting the presence of and compiling image data of a metallic object, said array of GMR sensors arranged in a checkerboard configuration such that axes of sensitivity of alternate said GMR sensors are orthogonally oriented;

an electronics portion electrically coupled to said array of GMR sensors, said electronics portion adapted to receive and process said image data of said metallic object compiled by said array of GMR sensors; and a display unit electrically coupled to said electronics portion, said display unit adapted to display an graphical representation of said metallic object detected by said array of GMR sensors.

19. The portable low-power metallic object detector of claim 18 wherein said display unit displays a two-dimensional image of said metallic object detected by said array of GMR sensors.

20. The portable low-power metallic object detector of claim 18 further comprising:

a second array of GMR sensors, said second array of GMR sensors disposed orthogonal to said first array of GMR sensors.

21. The portable low-power metallic object detector of claim 20 further comprising:

a third array of GMR sensors, said third array of GMR sensors disposed orthogonal to said first and second arrays of GMR sensors.

22. The portable low-power metallic object detector of claim 21 wherein said display unit displays a three-dimensional image of said metallic object detected by said first, second, and third array of GMR sensors.

* * * * *